Dec. 22, 1964 E. J. HENLEY 3,162,825

LC OSCILLATOR WITH PHASE SHIFTING FREQUENCY CONTROLS

Filed Sept. 9, 1960

INVENTOR
EDWARD J HENLEY
BY
Kraszewski & Nolan
ATTORNEYS

United States Patent Office 3,162,825
Patented Dec. 22, 1964

3,162,825

LC OSCILLATOR WITH PHASE SHIFTING FREQUENCY CONTROLS

Edward J. Henley, 140 Vinton Circle, Fanwood, N.J.
Filed Sept. 9, 1960, Ser. No. 54,886
2 Claims. (Cl. 331—108)

Figure 1:
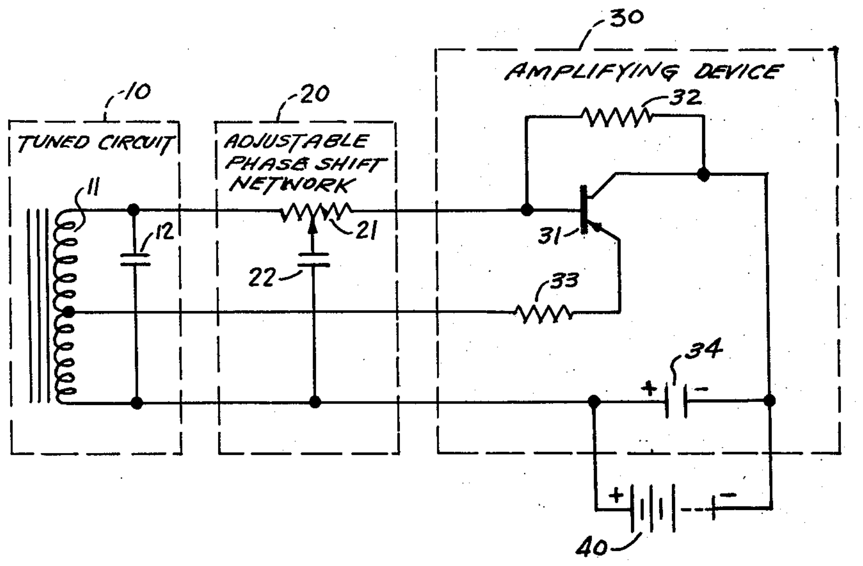

My invention relates to electronic oscillators, particularly to oscillators employing fixed inductors and capacitors as frequency determining elements, and has for its primary object to provide a limited, continuously adjustable means for setting the precise frequency of an oscillator employing fixed inductors and capacitors.

It is a further object of my invention to tune an oscillator over a limited frequency range without requiring the use of costly adjustable inductors or capacitors.

It is a still further object of my invention to use economical resistive and capacitive elements to tune an oscillator with minimum deleterious effects upon the frequency-determining tuned circuit.

A more complete understanding of the invention will be obtained from the following description of a preferred embodiment thereof, taken in conjunction with the following drawing, which shows a schematic diagram of an oscillator tuned according to the invention.

Many oscillator circuits which are well known in the art employ resistance-capacity phase-shift networks in conjunction with an amplifying device. The parameters of the phase-shift networks determine the oscillation frequencies. The oscillators are tuned by varying either the resistance or the capacity in the networks. In general, these oscillators are not stable and are more subject to outside influences than those in which the frequency is determined by inductance-capacity tuned circuits.

Several oscillator circuits employing inductance-capacity tuned circuits in conjunction with an amplifying device are commonly used to cover wide frequency ranges. However, none of these is completely satisfactory for the low audio range. Large adjustable capacitors are not generally available, and most adjustable inductors are either unstable or have too high a dissipation factor to be suitable for very low frequencies. One of the most satisfactory inductors from the standpoint of electrical characteristics is a coil wound upon a toroidal core of molybdenum-permalloy dust dispersed in an insulating binder. However, the inductance of these coils is not adjustable except by relatively expensive means such as magnetic biasing arrangements.

Referring now to the schematic diagram, which shows a conventional Hartley oscillator, I have incorporated both a tuned circuit 10 and an adjustable phase-shift network 20 into the oscillator circuit in order to utilize the advantages of both. The adjustable phase-shift network 20, which employs inexpensive resistive and capacitive elements is interposed between the tuned circuit 10 and an amplifying device 30, which latter device includes a transistor 31.

The tuned circuit 10 comprises a fixed inductance coil 11 and a fixed capacitance capacitor 12, which circuit determines the approximate frequency of the oscillator. The values of inductance and capacitance are chosen to provide the desired LC ratio.

Resistor 21 is a potentiometer which constitutes the variable element of the phase-shift network 20. Capacitor 22 constitutes the reactive element of the phase-shift network 20.

Transistor 31 with its conventional biasing and stabilizing resistors 32 and 33 and by-pass capacitor 34 constitute a conventional amplifying device 30 which is powered by a battery 40.

Others have tuned oscillators by shunting a variable resistor in series with a fixed capacitor across the oscillator tuned circuit. This has a serious effect upon the Q or dissipation factor of the tuned circuit. Furthermore, the tuning range is very restricted, since the maximum frequency change is never greater than the square root of the ratio of the maximum and minimum effective capacities.

In an oscillator according to my invention, the effect of the capacitor 22 is enhanced by the phase-shifting properties of the network 20. In this configuration, the percentage frequency change obtainable approximates the percentage that capacitor 22 is of the sum of capacitors 12 and 22. A good practice is to limit capacitor 22 to five or six percent of the value of capacitor 12.

Typical components used in an oscillator of my invention operating below 20 cycles per second are as follows.

| | |
|---|---|
| Coil: | |
| **11** | 12 henries (tapped at midpoint). |
| Capacitors: | |
| **12** | 6.0 microfarads. |
| **22** | 0.3 microfarad. |
| **34** | 20.0 microfarads. |
| Resistors: | |
| **21** | 2500 ohm potentiometer. |
| **32** | 47,000 ohms. |
| **33** | 120 ohms. |
| Transistor: | |
| **31** | Texas Instruments, Type 2N369 or equivalent, PNP junction transistor. |
| Battery: | |
| **40** | RCA Type VS300A (9 volts). |

Although the exemplary embodiment of my invention has been shown in a transistorized Hartley oscillator, it is readily understood that it is also applicable to other oscillator circuits employing various amplifying devices in conjunction with inductance-capacity tuned circuits. It is also apparent that the adjustable resistance-capacity phase-shift network may be another of the many well known types.

While the features of this invention have been disclosed with reference to the specific embodiment shown, it is, of course, understood that various modifications may be made in the details thereof without departing from the scope of this invention as defined in the appended claims.

What is claim is:

1. In an electronic oscillator, a parallel tuned inductance capacitance circuit, a first resistor, a second resistor, and a source of potential, all connected in series, a transistor having a base electrode, emitter electrode, and collector electrode, said base electrode being connected intermediate said first and second resistors, said collector electrode being connected to one side of said source of potential, said emitter electrode being connected to a tap on said tuned circuit, a shunt capacitor having one end variably positioned along said first resistor and the other end connected to the other side of said source of potential, said first resistor and said shunt capacitor forming a variable phase shifting network for varying the frequency of said oscillator.

2. The oscillator as claimed in claim 1, where a third resistor is connected between the emitter electrode and a tap on said tuned circuit.

References Cited in the file of this patent

UNITED STATES PATENTS

| | | |
|---|---|---|
| 2,523,856 | Baker | Sept. 26, 1950 |
| 2,556,296 | Rack | June 12, 1951 |
| 2,756,335 | Snyder | July 24, 1956 |